United States Patent
Yoshimoto et al.

(10) Patent No.: US 7,517,735 B2
(45) Date of Patent: Apr. 14, 2009

(54) METHOD OF MANUFACTURING ACTIVE MATRIX SUBSTRATE, ACTIVE MATRIX SUBSTRATE, ELECTRO-OPTICAL DEVICE, AND ELECTRONIC APPARATUS

(75) Inventors: Yoshikazu Yoshimoto, Matsuzaka (JP); Yoichi Noda, Fujimi-machi (JP); Atsushi Denda, Chino (JP); Toshimitsu Hirai, Chino (JP); Shinri Sakai, Suwa (JP)

(73) Assignee: Future Vision, Inc., Tokyo (JP)

( * ) Notice: Subject to any disclaimer, the term of this patent is extended or adjusted under 35 U.S.C. 154(b) by 0 days.

(21) Appl. No.: 11/206,784

(22) Filed: Aug. 19, 2005

(65) Prior Publication Data

US 2006/0046359 A1 Mar. 2, 2006

(30) Foreign Application Priority Data

Aug. 27, 2004 (JP) .............................. 2004-247920

(51) Int. Cl.
*H01L 21/82* (2006.01)
(52) U.S. Cl. ...................... 438/128; 438/149; 438/151; 257/E21.532
(58) Field of Classification Search .................. 438/128, 438/149, 151; 257/E21.532
See application file for complete search history.

(56) References Cited

U.S. PATENT DOCUMENTS

| | | | |
|---|---|---|---|
| 5,930,607 A | 7/1999 | Satou | |
| 6,885,110 B1 | 4/2005 | Ogawa | |
| 6,924,859 B2 | 8/2005 | Ishii et al. | |
| 6,933,988 B2 * | 8/2005 | Ohgami et al. | 349/39 |
| 7,015,503 B2 | 3/2006 | Seki et al. | |
| 7,068,418 B2 * | 6/2006 | Kawase | 359/296 |
| 2003/0155588 A1 * | 8/2003 | Murade | 257/213 |
| 2003/0214496 A1 * | 11/2003 | Ishii et al. | 345/204 |
| 2004/0036816 A1 | 2/2004 | Yun | |
| 2004/0125256 A1 | 7/2004 | Park et al. | |
| 2004/0232424 A1 | 11/2004 | Hotta et al. | |
| 2005/0136574 A1 * | 6/2005 | Shih | 438/151 |

FOREIGN PATENT DOCUMENTS

| | | |
|---|---|---|
| CN | 1439928 | 9/2003 |
| JP | A-02-170135 | 6/1990 |
| JP | A-2000-353594 | 12/2000 |
| JP | A-2001-281703 | 10/2001 |
| JP | B2 3261699 | 12/2001 |
| JP | A-2003-318192 | 11/2003 |
| KR | 1999-0033615 | 5/1999 |
| KR | 2002-0062275 | 7/2002 |
| KR | 2003-0057460 | 7/2003 |
| KR | 10-2004-0048944 | 6/2004 |
| WO | WO 2004/008423 A1 | 1/2004 |

* cited by examiner

*Primary Examiner*—Trung Dang
(74) *Attorney, Agent, or Firm*—Oliff & Berridge, PLC

(57) ABSTRACT

A method of manufacturing an active matrix substrate includes forming wiring lines each having a matrix pattern on a substrate such that a wiring line extending in any one of a first direction and a second direction is separated from another wiring line at an intersection; forming a laminated portion composed of an insulating layer and a semiconductor layer on a portion of the wiring line and the intersection; and forming a conductive layer electrically connecting the separated wiring line, and a pixel electrode electrically connected to the wiring line via the semiconductor layer on the laminated portion.

6 Claims, 15 Drawing Sheets

METHOD OF MANUFACTURING ACTIVE MATRIX SUBSTRATE, ACTIVE MATRIX SUBSTRATE, ELECTRO-OPTICAL DEVICE, AND ELECTRONIC APPARATUS

This application claims benefit of Japanese Patent Application No. 2004-247920 filed Aug. 27, 2004. The entire disclosure of the prior application is hereby incorporated by reference herein in its entirety.

BACKGROUND OF THE INVENTION

1. Technical Field

The present invention relates to a method of manufacturing an active matrix substrate, to an active matrix substrate, to an electro-optical device, and to an electronic apparatus.

2. Related Art

As portable apparatuses, such as notebook computers, cellular phones, and the like, have become wide spread, light and thin liquid crystal display devices have been employed therewith. According to this kind of liquid crystal device, a liquid crystal layer is interposed between an upper substrate and a lower substrate.

One example of the lower substrate (active matrix substrate) is shown in FIG. 17. As shown in FIG. 17, the lower substrate 1 includes a glass substrate 2, a gate scanning electrode 3 and a source electrode 4 disposed so as to cross each other on the glass substrate 2, a drain electrode 5 disposed on the glass substrate 2, a pixel electrode (ITO) 6 connected to the drain electrode 5, an insulating layer 7 interposed between the gate scanning electrode 3 and the source electrode 4, and a thin film transistor (TFT) 8 composed of a thin film semiconductor.

In formation of each metal wiring line in the lower substrate 1, for example, as disclosed in the Japanese Patent No. 3261699, a process combining a drying process and a photolithoetching process is repeatedly carried out several times.

However, since the above-described technique requires the process combining the drying process and the photolithoetching process to be carried out several times, it causes material cost or management cost to increase, and also makes it difficult to increase yield.

That is, a photosensitive material referred to as a resist is coated on a substrate where a conductive film is coated in advance, a circuit pattern is developed by irradiation, the conductive film is etched according to the resist pattern, and a thin-film wiring line pattern is formed. In addition, large equipment such as a vacuum device and a complicated process are required, and a usage effectiveness of the material is only several percent, and thus most of the material is wasted, which causes a manufacturing cost to increase.

Accordingly, it is required to reduce the number of processes in which the drying process and the photolithoetching process are combined in manufacturing a liquid crystal device which has been requested to have a low price in terms of its product cost.

SUMMARY

An advantage of the invention is that it provides a method of manufacturing an active matrix substrate capable of reducing the number of a process combined with a drying process and a photolithoetching process.

In the method of manufacturing an active matrix substrate, an active matrix substrate, an electro-optical device, and an electronic apparatus, the following is employed.

According to a first aspect of the invention, there is provided a method of manufacturing an active matrix substrate, including: forming wiring lines each having a matrix pattern on a substrate such that a wiring line extending in any one of a first direction and a second direction is separated from another wiring line at an intersection; forming a laminated portion composed of an insulating layer and a semiconductor layer on a portion of the wiring line and the intersection; and forming a conductive layer electrically connecting the separated wiring line, and a pixel electrode electrically connected to the wiring line via the semiconductor layer on the laminated portion.

According to this aspect, the number of the process combined with the drying process and the photolithoetching process can be reduced, thereby reducing a manufacturing cost and increasing a yield.

Preferably, the wiring line includes a source line, a gate line, and a capacitive line extending along the gate line in substantially a straight line, and the source line is separated at the intersection. Therefore, since these wiring lines can be prevented from contacting with each other, they can be simultaneously formed on the same plane.

Preferably, the forming of the wiring lines includes disposing a conductive material using an inkjet method. Therefore, the number of the process combined with the drying process and the photolithoetching process can be reduced.

Preferably, the forming of the laminated portion includes forming a laminated portion separated at the intersection on the capacitive line. Since the laminated portion on the capacitive line is not in contact with the laminated portion on the intersection, a current flowing in the conductive layer formed on the laminated portion of the intersection can be prevented from flowing into the laminated portion of the capacitive line.

Preferably, the forming of the laminated portion includes subjecting the semiconductor layer to a half exposure process to form a switching element. Therefore, the switching element can be easily formed.

Preferably, the forming of the conductive layer and the pixel electrode includes disposing a transparent conductive material using an inkjet method. The number of the process combined with the drying process and the photolithoetching process can be reduced.

Preferably, the forming of the conductive layer and the pixel electrode includes forming a bank for disposing the transparent conductive material at a predetermined position. The transparent conductive material can be disposed at a proper position.

According to a second aspect of the invention, there is provided an active matrix substrate manufactured using the method of manufacturing an active matrix substrate. According to this aspect, the active matrix substrate can be manufactured with a low cost.

According to a third aspect of the invention, there is provided an electro-optical device including the active matrix substrate. According to this aspect, the active matrix substrate can be used with a low cost, so that a cost of the electro-optical device can be suppressed.

According to a fourth aspect of the invention, there is provided an electronic apparatus including the electro-optical device. According to this aspect, the electro-optical device can be used with a low cost, so that a cost of the electronic apparatus can be suppressed.

BRIEF DESCRIPTION OF THE DRAWINGS

The invention will be described with reference to the accompanying drawings, wherein like numbers reference like elements, and wherein.

DESCRIPTION OF THE EMBODIMENTS

Hereinafter, a method of manufacturing an active matrix substrate, an active matrix substrate, an electro-optical device, and an electronic apparatus will be described with reference to accompanying drawings.

Active Matrix Substrate

Figure 1:
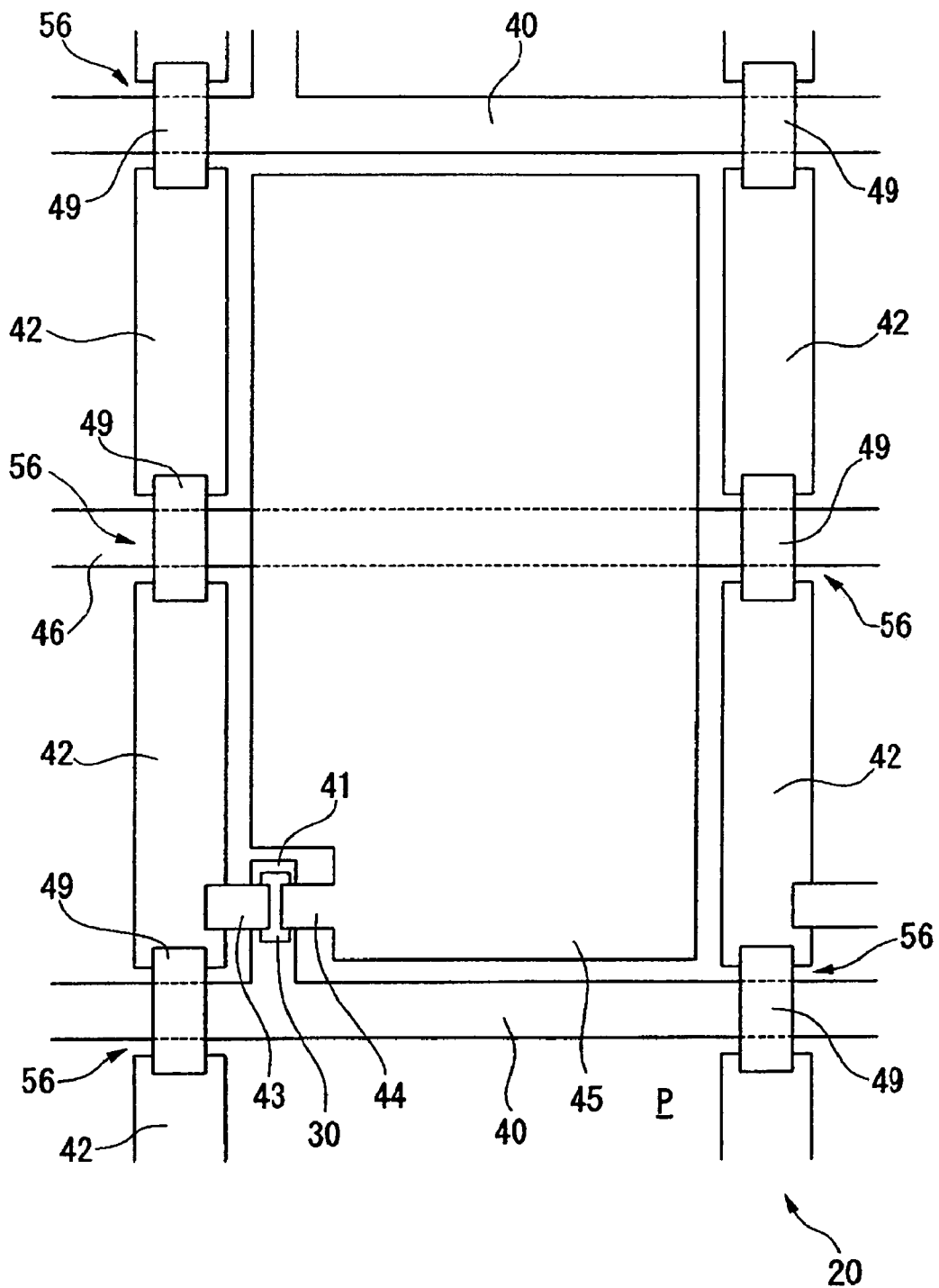
FIG. 1 is a partial enlarged view of an active matrix substrate.

FIG. 1 is a partial enlarged view of an active matrix substrate according to the invention.

Gate wiring lines 40 and source wiring lines 42 are provided in a matrix on an active matrix substrate 20. That is, a plurality of gate wiring lines 40 are formed so as to extend in an X-direction (first direction), and a plurality of source wiring lines 42 are formed so as to extend in a Y-direction (second direction).

In addition, a gate electrode 41 is connected to the gate wiring line 40, and a TFT 30 is disposed on the gate electrode 41 with an insulating layer interposed therebetween. In addition, a source electrode 43 is connected to the source wiring line 42, and the source electrode 43 has one terminal connected to the TFT (switching element) 30.

In addition, a pixel electrode 45 is disposed in a region surrounded by the gate wiring line 40 and the source wiring line 42, and is connected to the TFT 30 via a drain electrode 44.

In addition, a capacitive line 46 is disposed on the active matrix substrate 20 so as to be substantially parallel to the gate wiring line 40. The capacitive line 46 is disposed on a lower layer of the source wiring line 42 and the pixel electrode 45 with an insulating layer interposed therebetween.

In addition, the gate wiring line 40, the gate electrode 41, the source wiring line 42, and the capacitive line 46 are formed on the same plane.

Figure 2:
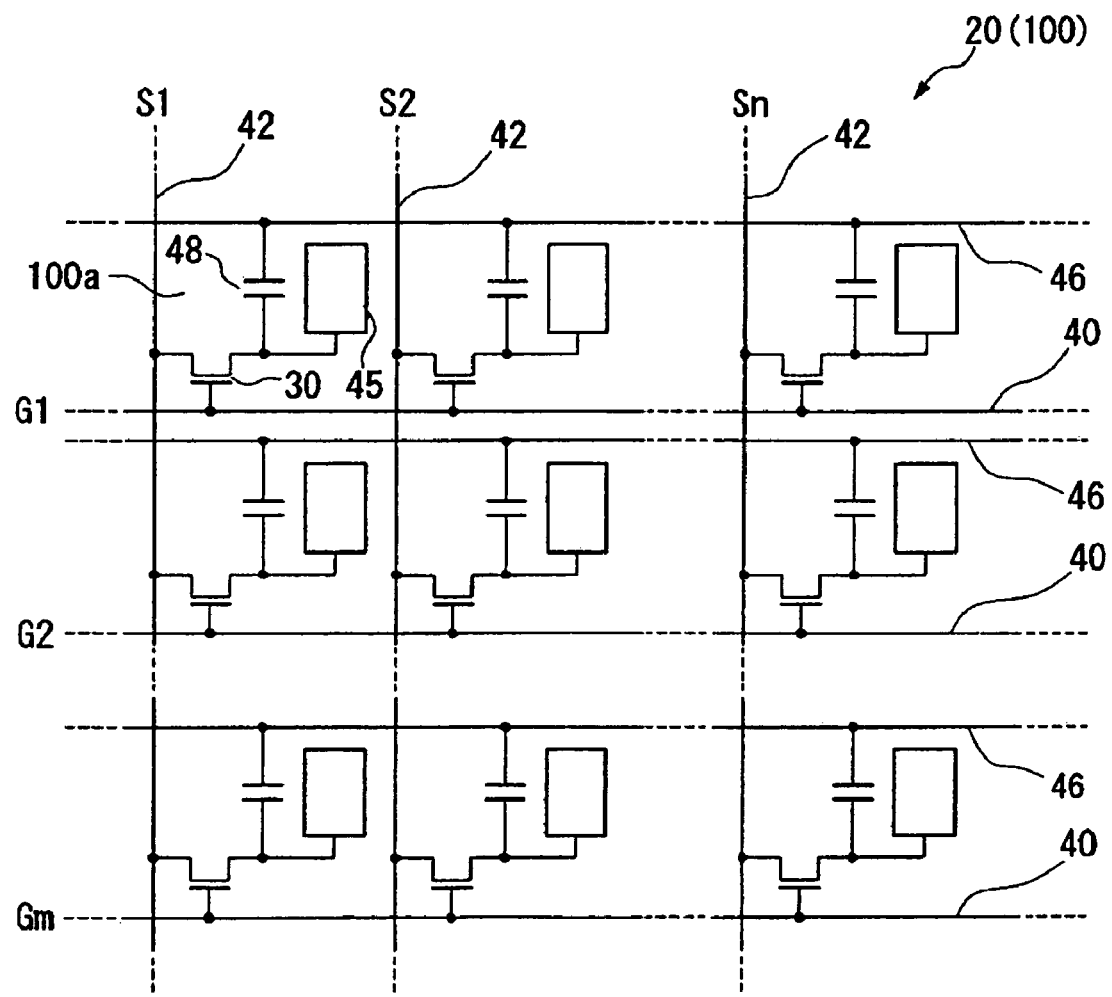
FIG. 2 is an equivalent circuit diagram of an active matrix substrate.

FIG. 2 is an equivalent circuit diagram of the active matrix substrate 20, which is used in a liquid crystal display device.

When the active matrix substrate 20 is used in the liquid crystal display device, a plurality of pixels 100a are arranged in a matrix in an image display region. A pixel switching TFT 30 is formed in each of these pixels 100a, and the source wiring line 42 for supplying each of pixel signals S1, S2, . . . , and Sn is electrically connected to a source of the TFT 30 via the source electrode 43. The pixel signals S1, S2, . . . , and Sn supplied through the source wiring lines 42 may be line-sequentially supplied in this order, or may be supplied for every group including a plurality of adjacent source wiring lines 42.

In addition, the gate wiring line 40 is electrically connected to a gate of the TFT 30 via the gate electrode 41. In addition, the gate wiring lines 40 are line-sequentially supplied with scanning signals G1, G2, . . . , and Gn with a predetermined timing in a pulsed manner.

The pixel electrode 45 is electrically connected to a drain of the TFT 30 via the drain electrode 44. In addition, the TFT 30 serving as a switching element is turned on for a predetermined period, so that the pixel signals S1, S2, . . . , and Sn supplied through the source wiring lines 42 are written in the respective pixels with a predetermined timing. In this way, the pixel signals S1, S2, . . . , and Sn having predetermined levels each written in liquid crystal via the pixel electrode 45 are held for a predetermined period between the pixel electrodes and a counter electrode 121 of a counter substrate 120 shown in FIG. 15.

In addition, in order to prevent the held pixel signals S1, S2, . . . , Sn from leaking, a storage capacitor 48 is additionally provided parallel to a liquid crystal capacitor formed between the pixel electrode 45 and the counter electrode 121 by the capacitive line 46. For example, the voltage of the pixel electrode 45 is held by the storage capacitor 48 for a period as much as three orders of magnitude longer than the time for which the source voltage is applied. Accordingly, holding characteristics of an electric charge can be improved, and a liquid crystal display device 100 having a high contrast ratio can be implemented.

Method of Manufacturing an Active Matrix Substrate

Next, a method of manufacturing the active matrix substrate 20 will be described with reference to accompanying drawings.

The active matrix substrate 20 is manufactured by a first process of forming a wiring line having a matrix pattern on a substrate P, a second process of forming a laminated portion 35, and a third process of forming a pixel electrode 45 and the like.

Hereinafter, the respective processes will be described in detail.

First Process: Forming a Wiring Line

Figure 3A:
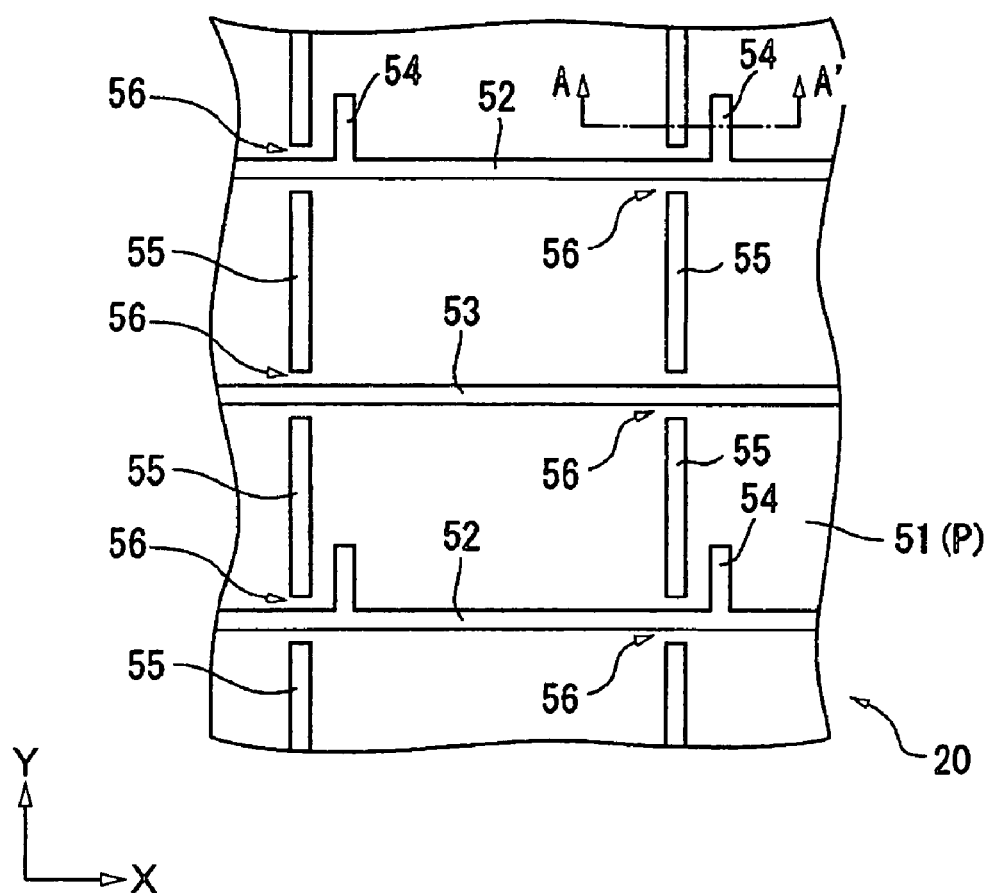
FIG. 3 is a diagram illustrating a sequence of manufacturing an active matrix substrate.
Figure 3B:
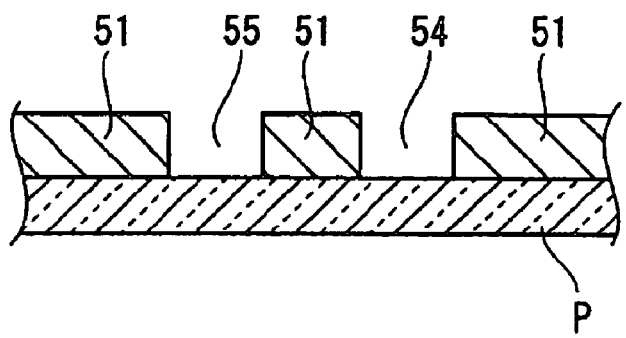
Figure 4A:
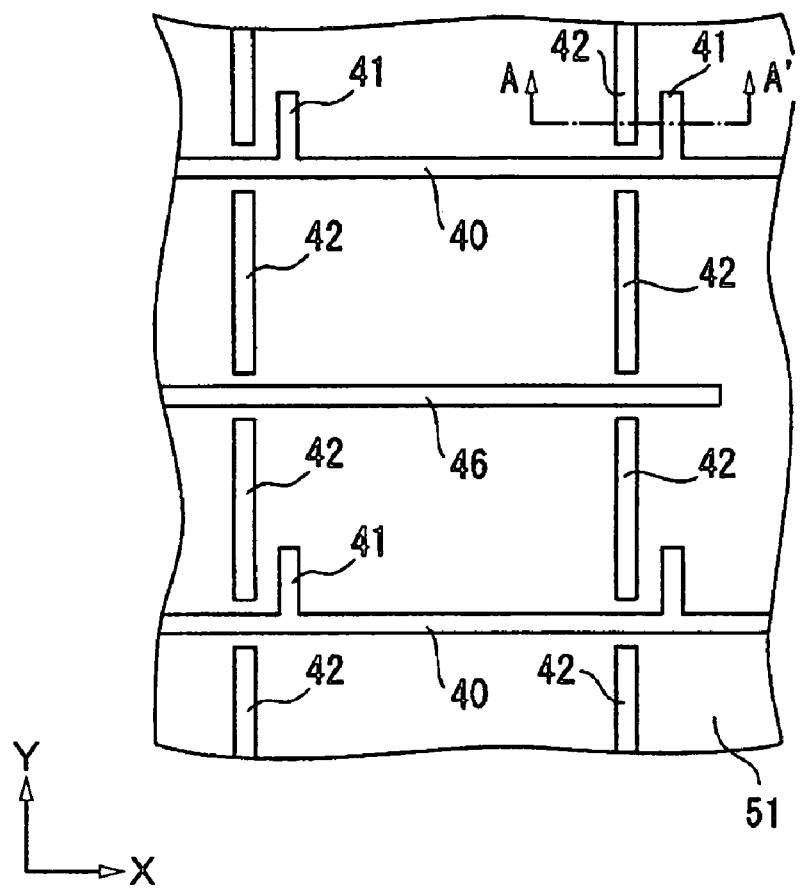
FIG. 4 is a diagram illustrating a sequence subsequent to the sequence of FIG. 3.
Figure 4B:
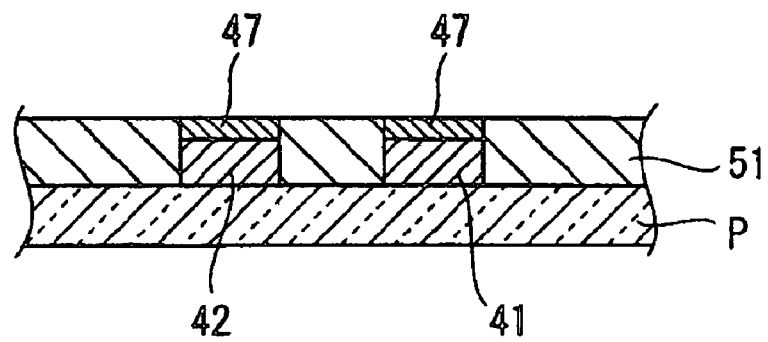

FIGS. 3 and 4 are diagrams illustrating the first process of forming the wiring line. In addition, FIGS. 3B and 4B are cross-sectional views taken along the lines IIIB-IIIB of FIG. 3A and IVB-IVB of FIG. 4A, respectively.

Various materials, such as glass, quartz glass, a Si wafer, a plastic film, a metal plate or the like, may be used as the substrate P where wiring lines, such as the gate wiring line 40 and the source wiring line 42, which have a matrix pattern, are formed. In addition, the substrate may include one that a semiconductor film, a metal film, a dielectric film, an organic film or the like are formed as a base layer on a surface of the substrate formed of the above-described materials.

First, as shown in FIG. 3, banks 51 each made of an insulating organic resin are formed on the substrate P. The bank is obtained by arranging ink for a wiring line at a predetermined location of the substrate P.

Specifically, as shown in FIG. 3A, the bank 51 having a plurality of openings 52, 53, 54, and 55 corresponding to positions where wiring lines each having a matrix pattern are formed on the cleaned substrate P, is formed using a photolithography method.

High molecular material, such as an acrylic resin, a polyimide resin, an olefin resin, a melamine resin or the like, may be used as a material of forming the bank 51. In addition, a lyophobic treatment is carried out to make ink for a wiring line pattern disposed within the openings 52, 53, 54, 55 in the bank 51. A $CF_4$ plasma treatment (such as a plasma treatment using a gas having a fluoric component) is used as the lyophobic treatment. In addition, a lyophobic component (fluoric base) may be applied into the bank 51 in advance instead of the $CF_4$ plasma treatment.

The openings 52, 53, 54, and 55 formed by the banks 51 correspond to wiring lines each having a matrix pattern, such as the gate wiring line 40 and the source wiring line 42. That is, the ink for a wiring line is disposed in the openings 52, 53, 54, and 55 of the banks 51, so that the wiring lines each having a matrix pattern, such as the gate wiring line 40 and the source wiring line 42, are formed.

Specifically, the openings 52 and 53 extending in an X-direction correspond to positions where the gate wiring line 40 and the capacitive line 46 are formed. In addition, the opening 54 corresponding to the position where the gate electrode 41 is formed is connected to the opening 52 corresponding to the position where the gate wiring line 40 is formed. In addition, the opening 55 extending in a Y-direction corresponds to the position where the source wiring line 42 is formed. In addition, the opening 55 extending in a Y-direction is separated at an intersection portion 56 such that it does not cross the openings 52 and 53 extending in the X-direction.

Subsequently, a droplet ejecting device IJ, which will be described below, makes ink for a wiring line including conductive fine particles ejected and disposed in the openings 52, 53, 54, and 55, thereby forming wiring lines each having a matrix pattern, such as the gate wiring line 40 and the source wiring line 42, on the substrate.

The ink for a wiring line is a dispersion solution in which the conductive fine particles are dispersed in a dispersion medium, or a solution in which an organic silver compound or a silver oxide nano particles are dispersed in a solvent (dispersion medium). In addition, the metal fine particles, such as gold, silver, copper, tin, lead or the like, oxides thereof, conductive polymers or fine particles of a superconductor are used as the conductive fine particle. Surfaces of these conductive fine particles may be coated with an organic material in order to enhance a dispersive property.

A diameter of the conductive fine particle is preferably within a range of from 1 nm to 0.1 μm. When the diameter exceeds 0.1 μm, a nozzle of a droplet ejecting head, which will be described below, may be clogged. In addition, when the diameter is less than 1 nm, a volume ratio of a coating agent with respect to the conductive fine particle increase, thereby significantly increasing a ratio of an organic material in a film to be obtained.

As the dispersion medium, so long as it is capable of dispersing the above-mentioned conductive fine particles without causing aggregation, there is no specific restriction. For example, in addition to water, it is possible to use alcohols, such as methanol, ethanol, propanol, and butanol; hydrocarbon compounds, such as n-heptane, n-octane, decane, dodecane, tetradecane, toluene, xylene, cymene, durene, indene, dipenten, tetrahydronaphthalene, decahydronaphthalene, and cyclohexylbenzene; ether compounds, such as ethyleneglycoldimethylether, ethyleneglycoldimethylethylether, ethyleneglycolmethylethylether, diethyleneglycoldimethylether, diethyleneglycoldiethylether, diethyleneglycolmethylethylether, 1,2-dimethoxyethane, bis(2-methoxyethyl) ether, and p-dioxane; and polar compounds such as propylenecarbonate, gamma-butyrolactone, N-methyl-2-pyrroridone, dimethylformamide, dimethylsulfoxyde, and cyclohexanone. Of these substances, water, alcohols, hydrocarbons, and ether compounds are preferable in terms of dispersibility of particulates and stability of a dispersed liquid as well as ease of application to the liquid droplet ejection method (inkjet method). For more preferable dispersion media, water and hydrocarbons may be cited.

A surface tension of the dispersion solution of the conductive fine particles is preferably 0.02 to 0.07 N/m. When the surface tension is less than 0.02 N/m in the case in which a liquid is ejected using an inkjet method, wettability of the ink composition with respect to a nozzle surface increases, thus a flying curve tends to occur. When the surface tension exceeds 0.07 N/m, a meniscus shape at a front end of the nozzle is not stable, thus it is difficult to control an ejection amount or ejection timing. In order to control the surface tension, a surface tension adjusting agent, such as a fluoric agent, a silicon agent, and a nonionic agent, may be added into the dispersion solution in a range of not significantly decreasing a contact angle with the substrate. The nonionic surface tension adjusting agent serves to enhance the wettability of the liquid to the substrate, improve a leveling property of a film, and prevent fine unevenness from occurring on the film. The surface tension adjusting agent may contain an organic compound, such as alcohol, ether, ester, and ketone, if necessary.

The viscosity of the dispersion solution is preferably 1 to 50 mPa·s. In the case in which the liquid material is ejected as the droplet using the inkjet method, when the viscosity is less than 1 mPa·s, a nozzle periphery is likely to be contaminated by an outflow of the ink. In addition, when the viscosity exceeds 50 mPa·s, the clogging occurs very often at the nozzle opening, which makes it difficult to eject the droplet smoothly.

After the ink for a wiring line is ejected onto the substrate P, a drying process and a sintering process are carried out in order to remove the dispersion medium, if necessary.

The drying process may employ a typical heating treatment using a common hot plate, an electric furnace or the like for heating the substrate P. For example, it is heated for sixty minutes at 180° C.

The temperature in the sintering process is properly determined in consideration of a boiling point of the dispersion medium (vapor pressure), thermal behavior, such as dispersity or oxidizing property of the fine particle, the presence/absence or amount of the coating agent, a heat-resistant temperature of the base material or the like. For example, it is necessary to perform sintering at about 250° C. in order to remove the coating agent made of an organic material.

By means of these drying/sintering processes, an electrical contact between conductive fine particles is ensured, and they are converted to a conductive film.

In addition, a metal protective film 47 may be formed on the wiring lines, such as the gate wiring line 40 or the source wiring line 42. The metal protective film 47 is a thin film for suppressing (electro) migration behavior of a conductive film formed of silver or copper. Nickel is preferably used to form the metal protective film 47. In addition, the metal protective film 47 formed of nickel is also disposed on the substrate P using a droplet ejecting method.

By using to the above-described processes, the banks 51 and layers composed of wiring lines each having a matrix pattern are formed on the substrate P, as shown in FIG. 4.

The ejection technique of the droplet ejecting method may include an electrification control method, a pressurized vibration method, an electromechanical conversion method, an electrothermal conversion method, and an electrostatic absorption method. The electrification control method applies an electric charge to the material through an electrification electrode, and controls a flying direction of a material at a deflection electrode to make it eject from the nozzle. In addition, the pressure oscillation method applies a super high pressure of about 30 kg/cm$^2$ to the material to make the material eject from the front end of the nozzle. In addition, when a control voltage is not applied thereto, the material moves forward and is then ejected from the nozzle, and when the control voltage is applied thereto, an electrostatic reaction occurs between materials, so that the materials are scattered and then are not ejected from the nozzle. In addition, the electromechanical conversion method uses a property that a piezo element (piezo-electric element) receives a pulsed electric signal and is then deformed, so that a pressure is applied to the space where the material is stored through a flexible material, thereby pressing the material in the space so as to be ejected from the nozzle.

In addition, the electrothermal conversion method uses a heater disposed in the space where the material is stored to rapidly evaporate the material to generate bubbles, and make the material stored in the space ejected by the pressure of the bubbles. The electrostatic absorption method applies a weak pressure to the space where the material is stored, forms a meniscus of the material at the nozzle, applies an electrostatic attractive force in this state, and causes the material to be ejected. In addition, a method of using a change in viscosity of a fluid due to an electric field, and a method of using a discharge spark to make the material blow off may be employed. The droplet ejecting method has advantages in that there is less waste in using the material, and a desired amount of material can be exactly arranged at a desired position. In addition, the amount of one droplet of a liquid phase material (fluid) ejected by the droplet ejecting method is, for example, 1 to 300 nanograms.

Figure 5:
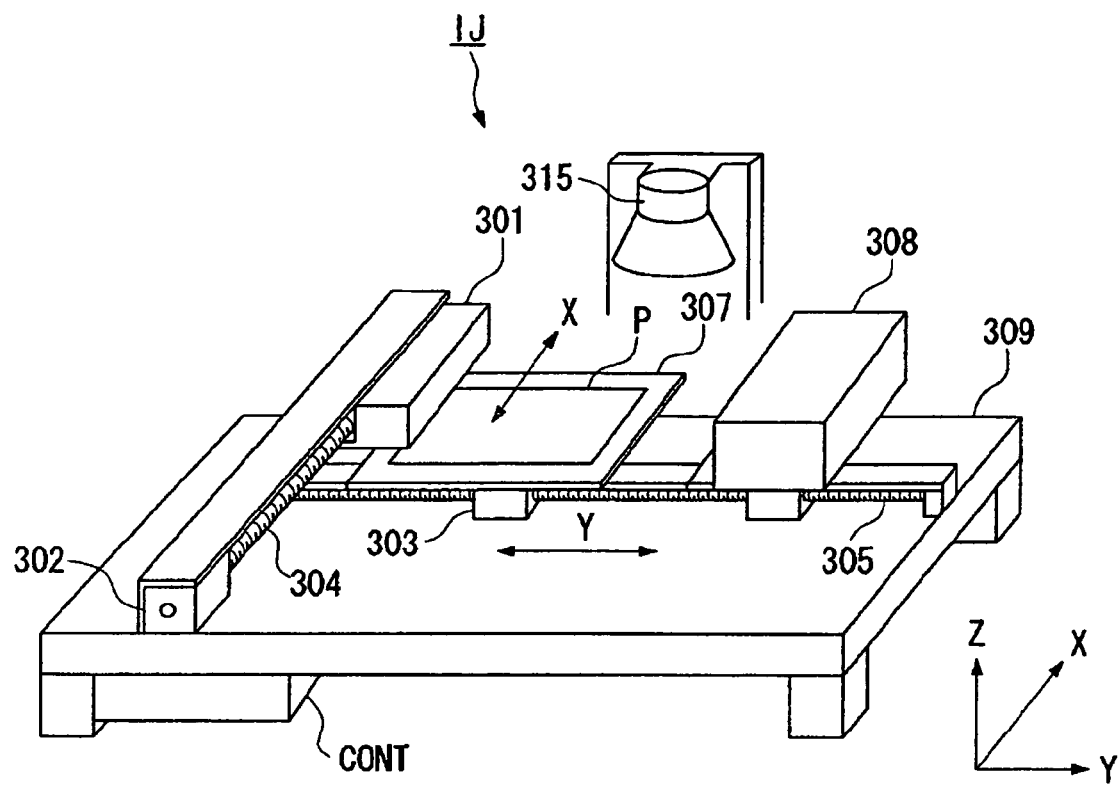
FIG. 5 is a schematic perspective view of a droplet ejecting device.

By way of example, a droplet ejecting device IJ shown in FIG. 5 is used as a droplet ejecting device IJ used for forming a wiring line having a matrix pattern.

The droplet ejecting device (inkjet device) IJ ejects (drops) droplets onto the substrate P through a droplet ejecting head, and includes a droplet ejecting head 301, an X-direction driving shaft 304, a Y-direction guide shaft 305, a controller CONT, a stage 307, a cleaning mechanism 308, a base 309, and a heater 315. The stage 307 supports the substrate P for arranging ink (liquid material) using the droplet ejecting device IJ, and has a fixing mechanism (not shown) for fixing the substrate P to a reference position.

The droplet ejecting head 301 is a multi-nozzle-type droplet ejecting head having a plurality of ejection nozzles, and its longitudinal direction aligns with the Y-axis direction. The plurality of ejection nozzles are arranged on a bottom surface of the droplet ejecting head 301 at a predetermined gap toward the Y-axis direction. The ink including the above-described conductive fine particles are ejected from the ejection nozzles of the droplet ejecting head 301 to the substrate P supported by the stage 307.

An X-direction driving motor 302 is connected to the X-direction driving shaft 304. The X-direction driving motor 302 is, for example, a stepping motor, and rotates the X-direction driving shaft 304 when an X-direction driving signal is supplied from the controller CONT. When the X-direction driving shaft 304 rotates, the droplet ejecting head 301 moves in the X-axis direction.

The Y-direction guide shaft 305 is fixed such that it does not move to the base 309. The stage 307 includes a Y-direction driving motor 303. The Y-direction driving motor 303 is, for example, a stepping motor, and moves the stage 307 in the Y-direction when a Y-direction driving signal is supplied from the controller CONT.

The controller CONT supplies a voltage for controlling the droplet ejection to the droplet ejecting head 301. In addition, it supplies a driving pulse signal for controlling the movement of the droplet ejecting head 301 toward the X-direction to the X-direction driving motor 302, and supplies a driving pulse signal for controlling the movement of the stage 307 toward the Y-direction to the Y-direction driving motor 303.

The cleaning mechanism 308 cleans the droplet ejecting head 301. A Y-direction driving motor (not shown) is provided in the cleaning mechanism 308. By driving the Y-direction driving motor, the cleaning mechanism moves along the Y-direction guide shaft 305. Movement of the cleaning mechanism 308 is also controlled by the controller CONT.

The heater 315 is a unit for thermally treating the substrate P by means of lamp annealing, and carries out evaporation and drying of the solvent contained in the liquid material coated on the substrate P. Whether the power supply is supplied to the heater 315 or not is also controlled by the controller CONT.

The droplet ejecting device IJ ejects droplets to the substrate P while relatively scanning the stage 307 supporting the substrate P and the droplet ejecting head 301. Hereinafter, the X-direction is referred to as a scanning direction and the Y-direction orthogonal to the X-direction is referred to as a non-scanning direction.

Accordingly, the ejection nozzles of the droplet ejecting head 301 are arranged in the Y-direction serving as the non-scanning direction at a predetermined interval. In FIG. 5, although the liquid droplet ejection head 301 is placed at a right angle to an advancing direction of the substrate P, an angle of the liquid droplet ejection head 301 may be adjusted, so that it may intersect the advancing direction of the substrate P. Accordingly, a pitch between nozzles can be adjusted by adjusting the angle of the droplet ejecting head 301. In addition, a distance between the substrate P and the nozzle plane may be arbitrarily adjusted.

Figure 6:
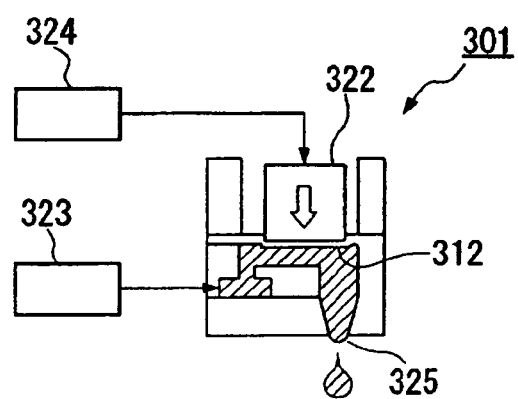
FIG. 6 is a cross-sectional view of a droplet ejecting head.
Figure 7A:
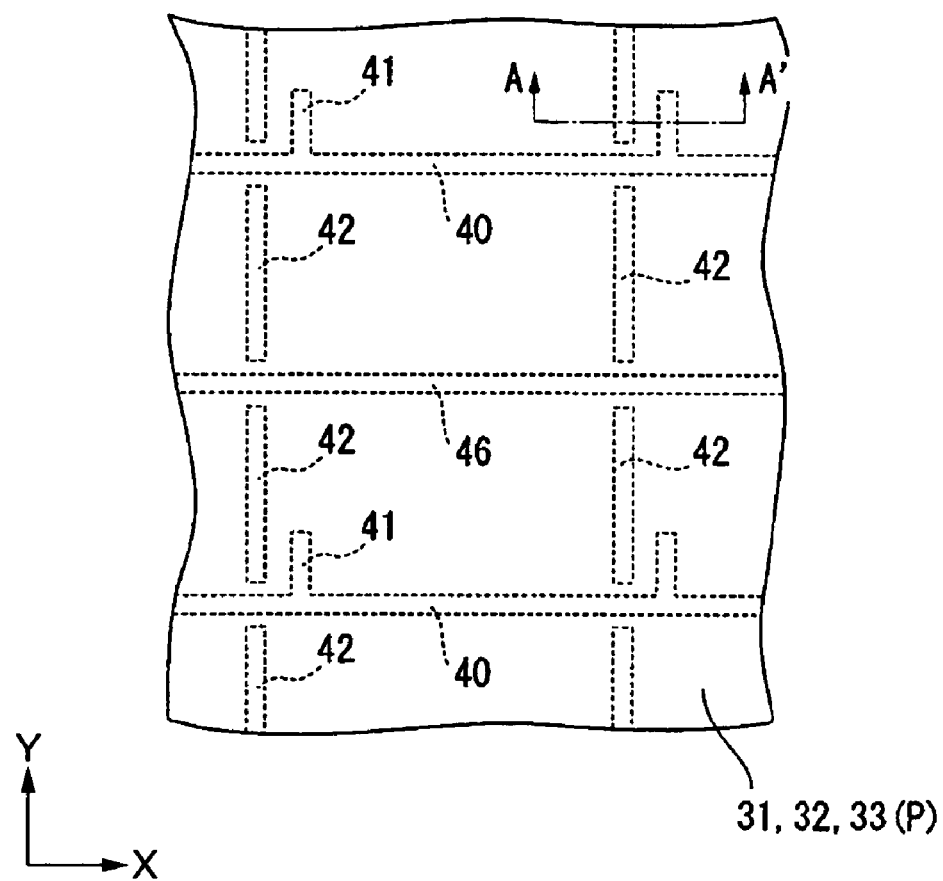
FIG. 7 is a diagram illustrating a sequence subsequent to the sequence of FIG. 4.
Figure 7B:
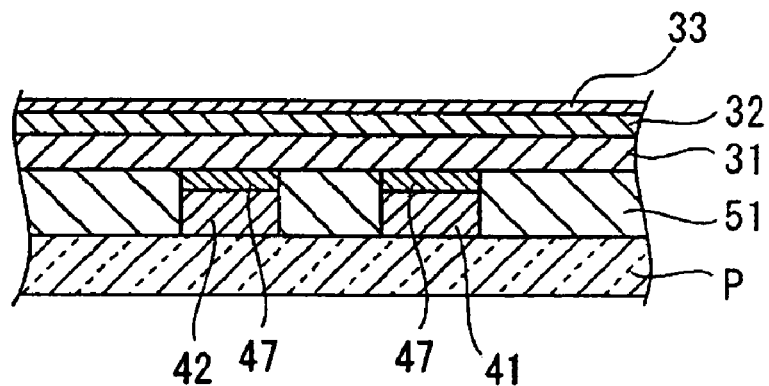

FIG. 6 is a cross-sectional view of the droplet ejecting head 301.

A piezo element 322 is arranged adjacent to a liquid chamber 321 accommodating a liquid material (ink for a wiring line) in the droplet ejecting head 301. The liquid material is supplied through a liquid material supplying system 323 including a material tank accommodating the liquid material in the liquid chamber 321.

The piezo element 322 is connected to a driving circuit 324, and a voltage is applied to the piezo element 322 through the driving circuit 324 to deform the piezo element 322. As a result, the liquid chamber 321 is deformed and the liquid materials are ejected from the nozzle 325.

In this case, a value of the applied voltage can be changed to control the amount of distortion of the piezo element 322. In addition, a frequency of the applied voltage can be changed to control the speed of distortion of the piezo element 322. The droplet ejection using the piezo method does not apply heat to the material, thus a composition of the material is not affected.

Second Process: Forming a Laminated Portion

FIGS. 7 to 10 are diagrams illustrating a process of forming a laminated portion which is the second process. In addition, FIG. 7B is a cross-sectional view taken along the line VIIB-VIIB of FIG. 7A, FIG. 8B is a cross-sectional view taken along the line VIIIB-VIIIB of FIG. 8A, and FIG. 9B is a cross-sectional view taken along the line IXB-IXB of FIG. 9A, and FIG. 10B is a cross-sectional view taken along the line XB-IXB of FIG. 10A. FIG. 8C is a cross-sectional view taken along the line VIIIC-VIIIC of FIG. 8A, FIG. 9C is a cross-sectional view taken along the line IXC-IXC of FIG. 9A, and FIG. 10C is a cross-sectional view taken along the line XC-XC of FIG. 10A. The second process forms a laminated portion 35 composed of an insulating film 31 and a semiconductor film (a contact layer 33 and an active layer 32) at a predetermined position of a layer composed of the bank 51 and wiring lines each having a matrix pattern.

First, the insulating film 31, the active layer 32, and the contact layer 33 are continuously formed on the entire surface of the substrate P using a plasma CVD method. Specifically, as shown in FIG. 7, a silicon nitride film serving as the insulating film 31, an amorphous silicon layer serving as the active layer 32, and an $n^+$-type silicon film serving as the contact layer 33 are continuously formed while changing a raw gas or a plasma condition.

Figure 8A:
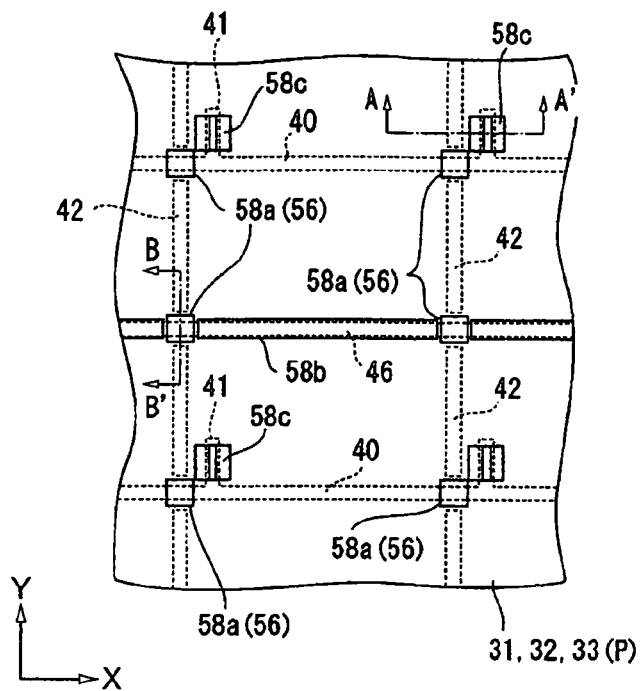
FIG. 8 is a diagram illustrating a sequence subsequent to the sequence of FIG. 7.

Subsequently, as shown in FIG. 8, a resist 58 (58a to 58c) is arranged at a predetermined position using a photolithography method. The predetermined position includes a position on an intersection 56 of the gate wiring line 40 and the source wiring line 42, a position on the gate electrode 41, and a position on the capacitive line 64, as shown in FIG. 8A.

Figure 8B:
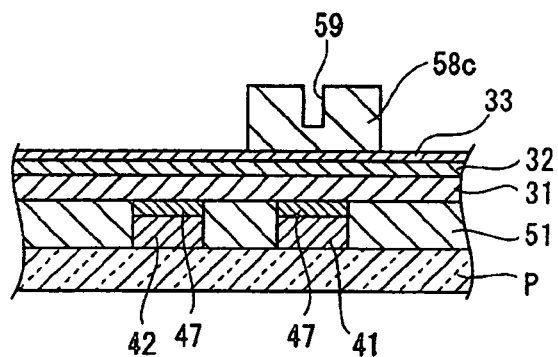
Figure 8C:
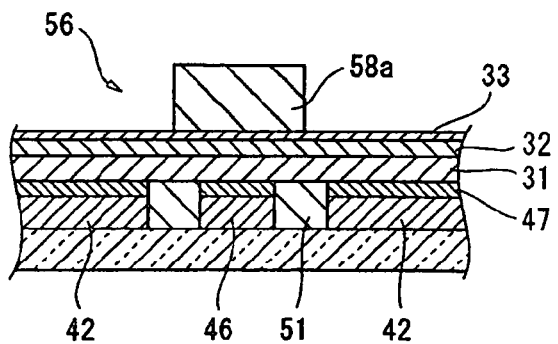

Further, the resist 58a disposed on the intersection 56 does not come into contact with the resist 58b disposed on the capacitive line 46. In addition, a half exposure process is performed on the resist 58c disposed on the gate electrode 41, thereby forming a groove 59, as shown in FIG. 8B.

Subsequently, etching is carried out on the entire surface of the substrate P to remove the contact layer 33 and the active layer 32. In addition, etching is carried out to remove the insulating film 31.

As a result, the contact layer 33, the active layer 32, and the insulating film 31 are removed in regions other than the predetermined position where the resist 58 (58a to 58c) is disposed, as shown in FIG. 9. On the other hand, the laminated portion 35 composed of the insulating film 31 and the semiconductor film (the contact layer 33 and the active layer 32) is formed at the predetermined position where the resist 58 is disposed.

Figure 9A:
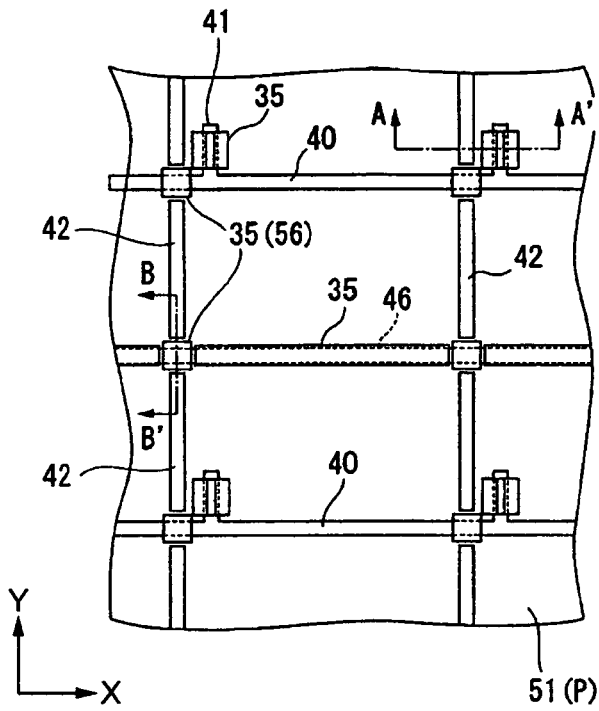
FIG. 9 is a diagram illustrating a sequence subsequent to the sequence of FIG. 8.
Figure 9B:
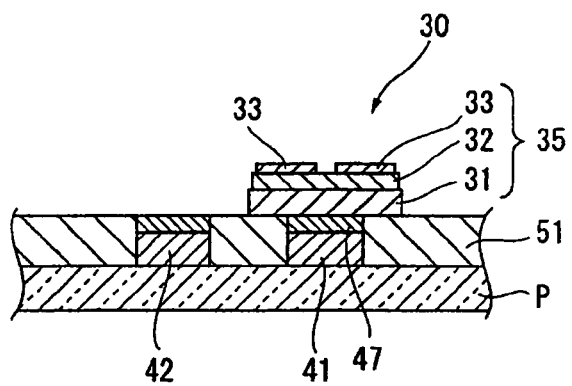
Figure 9C:
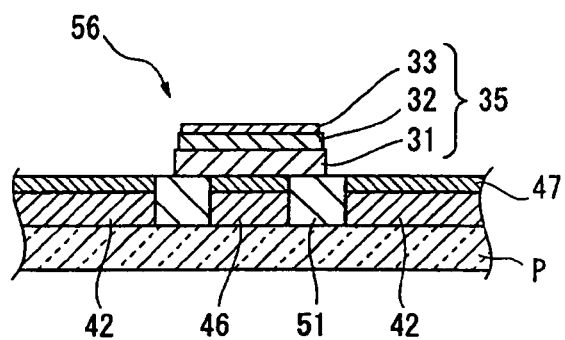
Figure 10A:
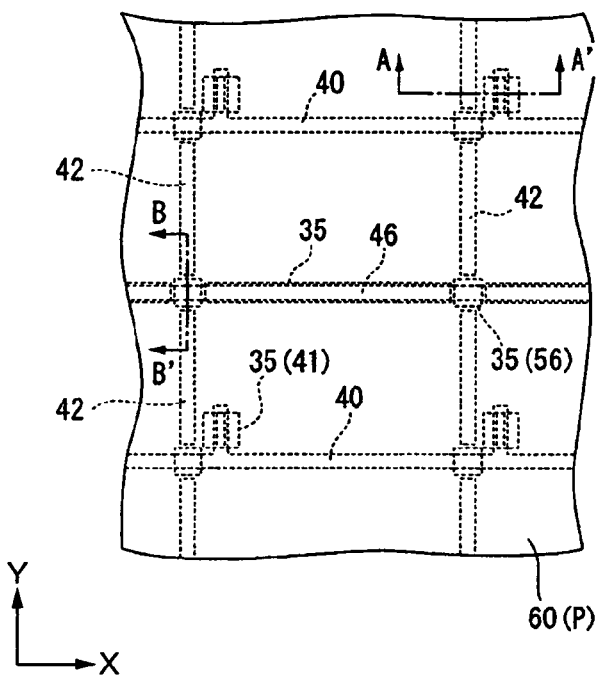
FIG. 10 is a diagram illustrating a sequence subsequent to the sequence of FIG. 9.
Figure 10B:
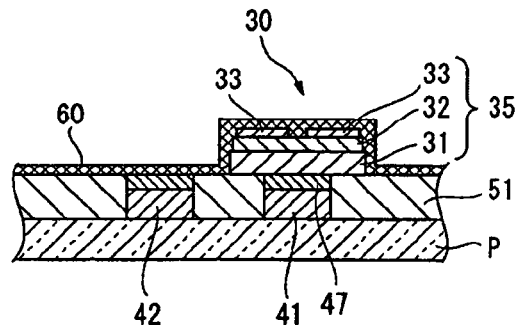
Figure 10C:
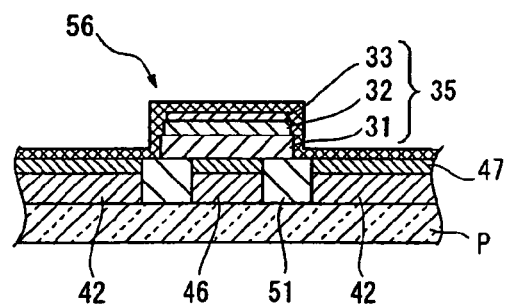

In addition, since the groove 59 is formed by performing the half exposure process on the resist 58c in the laminated portion 35 formed on the gate electrode 41, it is developed again before etching, thereby penetrating the groove. As shown in FIG. 9B, a portion of the contact layer 33 corresponding to the groove 59 is removed, thereby dividing the contact layer into two regions. Accordingly, a TFT 30, which serves as a switching element and which is composed of the active layer 32 and the contact layer 33, is formed on the gate electrode 41.

In addition, a silicon nitride layer, which serves as a protective layer 60 for protecting the contact layer 33, is formed on the entire surface of the substrate P, as shown in FIG. 10.

In this way, formation of the laminated portion 35 is completed.

Third Process

Figure 11A:
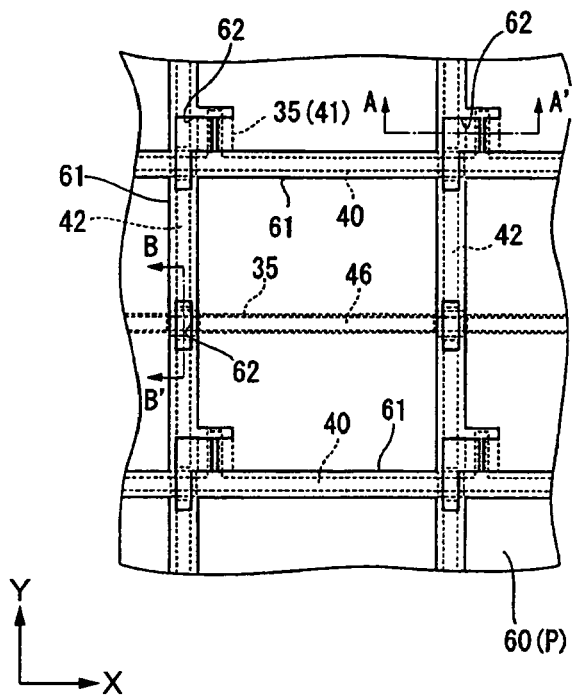
FIG. 11 is a diagram illustrating a sequence subsequent to the sequence of FIG. 10.
Figure 11B:
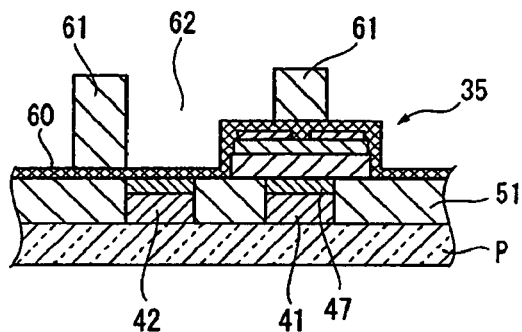
Figure 11C:
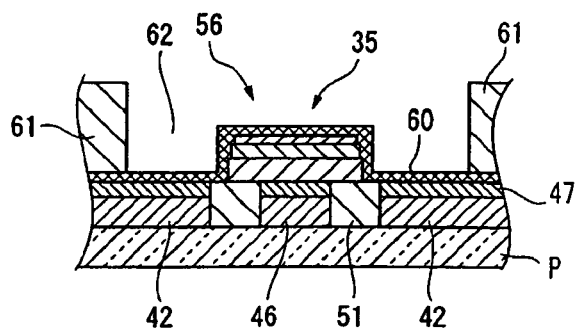
Figure 12A:
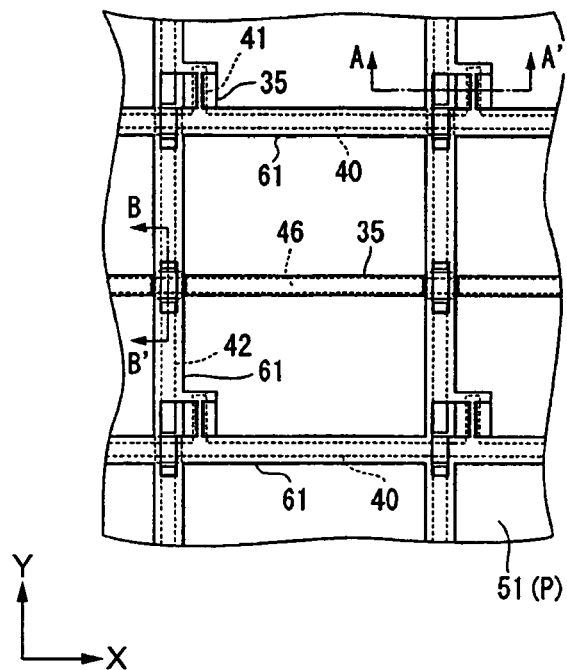
FIG. 12 is a diagram illustrating a sequence subsequent to the sequence of FIG. 11.
Figure 12B:
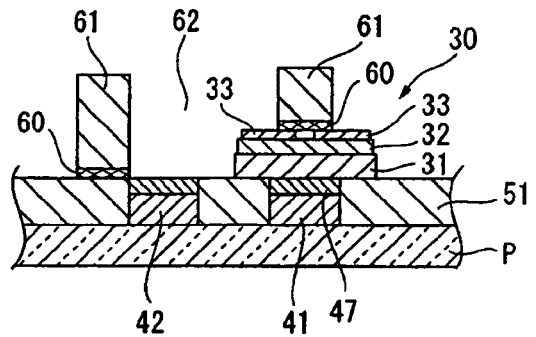
Figure 12C:
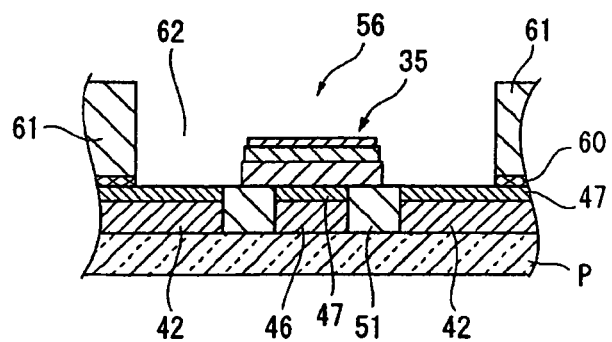
Figure 13A:
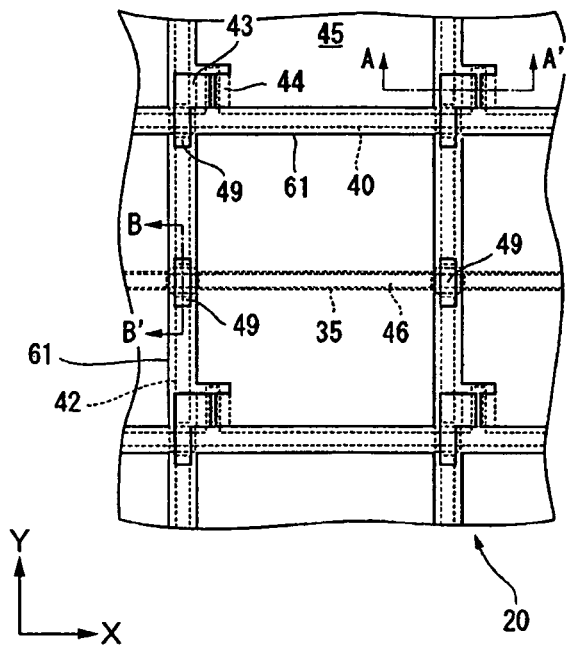
FIG. 13 is a diagram illustrating a sequence subsequent to the sequence of FIG. 12.
Figure 13B:
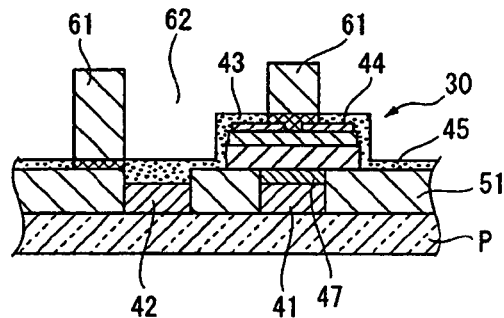
Figure 13C:
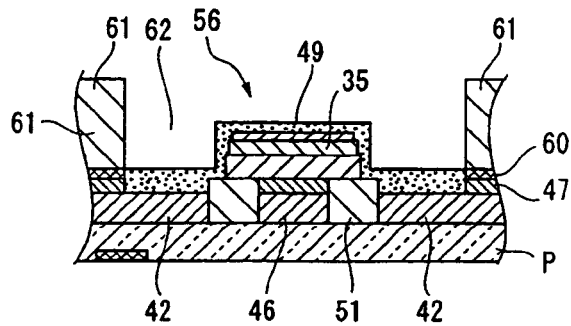

FIGS. 11 to 13 are diagrams illustrating a process of forming the pixel electrode 45 which is the third process. In addition, FIG. 11B is a cross-sectional view taken along the line XIB-XIB of FIG. 11A, FIG. 12B is a cross-sectional view taken along the line XIIB-XIIB of FIG. 12A, and FIG. 13B is a cross-sectional view taken along the line XIIIB-XIIIB of FIG. 13A. In addition, FIG. 11C is a cross-sectional view taken along the line XIC-XIC of FIG. 11A, FIG. 12C is a cross-sectional view taken along the line XIIC-XIIC of FIG. 12A, and FIG. 13C is a cross-sectional view taken along the line XIIIC-XIIIC of FIG. 13A. In the third process, the source electrode 43, the drain electrode 44, the conductive layer 49, and the pixel electrode 45 are formed.

The source electrode 43, the drain electrode 44, the conductive layer 49, and the pixel electrode 45 may be formed of, for example, a light-transmitting material such as an indium tin oxide (ITO). In addition, the same droplet ejecting method as the first process is also employed for forming these electrodes.

First, banks 61 are formed so as to cover the gate wiring line 40 and the source wiring line 42 using a photolithography method. That is, the bank 61 having a matrix shape is formed, as shown in FIG. 11. In addition, openings 62 are formed to correspond to intersections 56 of the source wiring lines 42 and the gate wiring lines 40 and of the source wiring lines 42 and the capacitive lines 46.

In addition, the opening 62 is formed such that a portion of the laminated portion 35 (TFT 30) formed on the gate electrode 41 is exposed, as shown in FIG. 11B. That is, the bank 61 is formed so as to make the laminated portion 35 (TFT 30) divided into two portions in the X-direction.

The polymer material, such as an acrylic resin, a polyimide resin, an olefin resin, and a melamine resin, is employed as a material for forming the bank 61, as in the above-mentioned bank 51. In addition, the same lyophobic process as used for the bank 51 is carried out.

The opening 62 formed by the bank 61 corresponds to the position where the source electrode 43 or the conductive layer 49 connecting the separated source wiring line 42 is formed. In addition, a region surrounded by the bank 61 corresponds to the position where the pixel electrode 45 and the drain electrode 44 are formed. That is, a transparent conductive material is arranged within the opening 62 of the bank 61 and the region surrounded by the bank 61, thereby forming the conductive layer 49 connecting the separated source wiring line 42, the source electrode 43, the drain electrode 44, and the pixel electrode 45. Alternatively, a conductive material other than the transparent conductive material may be arranged in the opening 62.

Subsequently, the protective layer 60 formed on the entire surface of the substrate P is removed by etching. Accordingly, the protective layer 60 formed on a region where the bank 61 is not formed is removed, as shown in FIG. 12. In addition, the metal protective film 47 formed on the wiring line having a matrix pattern is removed.

Subsequently, the transparent conductive material is ejected and arranged in the region surrounded by the bank 61 and in the opening 62 of the bank 61 by the above-described droplet ejecting device IJ. The transparent conductive material is a dispersion solution in which conductive fine particles of ITO are dispersed in a dispersion medium.

In addition, a drying process and a sintering process are carried out in order to remove the dispersion medium after the transparent conductive material is ejected to the substrate P, if necessary. By means of these drying and sintering processes, an electrical contact between conductive fine particles is ensured, and they are converted into a conductive layer.

In this way, the conductive layer 49 connecting the separated source wiring line 42, the source electrode 43, the drain electrode 44, and the pixel electrode 45 are formed on the substrate P, as shown in FIG. 13.

In addition, a method of arranging the transparent conductive material using the droplet ejecting method is exemplified in the present embodiment. However, the transparent conductive material may be arranged by performing CVD and etching processes. In this case, the bank 61 is unnecessary.

By means of the above-described processes, the active matrix substrate 20 is manufactured.

As such, the active matrix substrate 20 is manufactured by the first process of forming a wiring line having a matrix pattern on the substrate P, the second process of forming the laminated portion 35, and the third process of forming the pixel electrode 45 or the like, so that the number of the processes combined with the drying process and the photolithoetching process can be reduced. That is, since the gate wiring line 40 and the source wiring line 42 are simultaneously formed, the number of processes combined with the drying process and the photolithoetching process can be reduced by one.

In addition, the conductive material can be disposed on the substrate P using the droplet ejecting method in the first to third processes, so that the number of the process combined with the drying process and the photolithoetching process can be further reduced.

In addition, the laminated portion 35 (the insulating layer 31, the active layer 32, and the contact layer 33) formed on the capacitive line 46 is separated from the laminated portion 35 formed on the intersection 56 so as not to come into contact with each other, so that the current flowing through the source wiring line 42 can be prevented from flowing into the laminated portion 35 on the capacitive line 46.

That is, among layers constituting the laminated portion 35, the contact layer 33 is a conductive layer, and a conductive portion 49 connecting the source wiring line 42 is formed on the laminated portion 35 (contact layer 33) on the intersection 56. For this reason, the current flowing in the source wiring line 42 also flows in the contact layer 33. Accordingly, when the laminated portion 35 on the capacitive line 46 is in contact with the laminated portion 35 on the intersection 56, the current flowing in the source wiring line 42 flows into the laminated portion 35 on the capacitive line 46.

Accordingly, according to the active matrix substrate 20 of the invention, these problems can be resolved, thereby achieving a desired performance.

In addition, in the present embodiment, the case is exemplified in which the source wiring line 42 is divided at the intersection 56. However, the gate wiring line 40 may be divided at the intersection 56.

In addition, in the present embodiment, the laminated portion 35 on the capacitive line 46 is not in contact with the laminated portion 35 on the intersection 56, so that the current flowing in the source wiring line 42 does not flow into the laminated portion 35 on the capacitive line 46. However, the contact layer 33 of the laminated portion 35 on the intersection 56 may be simultaneously removed at the time of forming the TFT 30 to resolve the problem.

Electro-Optical Device

Next, a liquid crystal display device 100, which is an example of the electro-optical device using the active matrix substrate 20, will be described.

Figure 14:
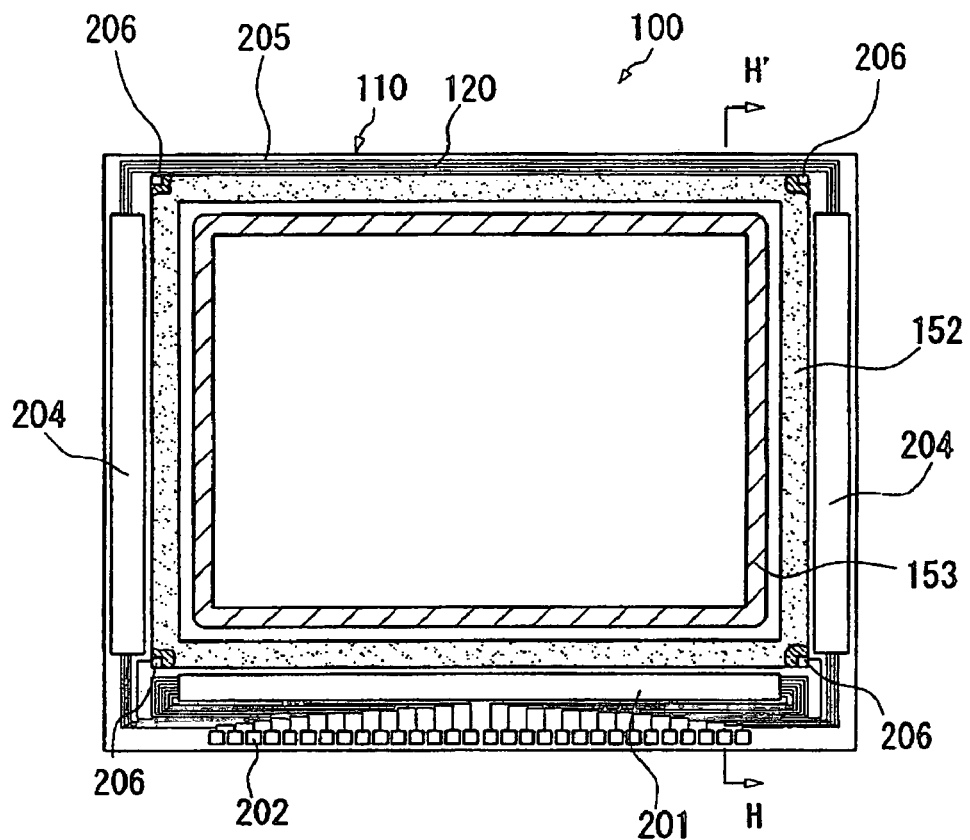
FIG. 14 is a plan view of a liquid crystal display device when seen from a counter substrate side.
Figure 15:
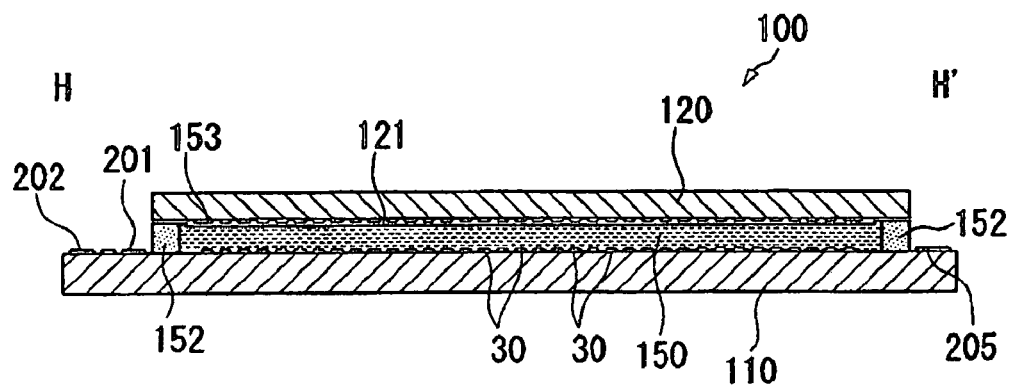
FIG. 15 is a cross-sectional view of a liquid crystal display device.

FIG. 14 is a plan view of the liquid crystal display device 100 when seen from its counter substrate side, and FIG. 15 is a cross-sectional view taken along the line XV-XV of FIG. 14.

In addition, in respective drawings described below, the scale of each layer or member has been adjusted in order to have a recognizable size.

Referring to FIGS. 14 and 15, in a liquid crystal display device (electro-optical device) 100, a TFT array substrate 110 including the active matrix substrate 20 and a counter substrate 120 are bonded to each other by a sealant 152 which is a photo-curable sealant, and liquid crystal 150 is sealed and held in a region defined by the sealant 152. The sealant 152 has a closed frame shape in a region within the substrate plane, and does not have a liquid crystal inlet, and acts not to leave the sealed mark resulted from the sealant.

A peripheral fringing 153 formed of a light shielding material is formed in a region inside the region where the sealant 152 is formed. A data line driving circuits 201 and mounting terminals 202 are formed along one side of the TFT array substrate 110 in a region outside the sealant 152, and scanning line driving circuits 204 are formed along two sides adjacent to the one side. A plurality of wiring lines 205 for connecting the two scanning line driving circuits 204 provided at both sides of the image display region are provided at the remaining one side of the TFT array substrate 110. In addition, an inter-substrate conductive member 206 for electrically connecting the TFT array substrate 110 and the counter substrate 120 is arranged at least one of corners of the counter substrate 120.

In addition, instead of the data line driving circuit 201 and the scanning line driving circuit 204 formed on the TFT array substrate 110, a tape automated bonding (TAB) substrate where a driving LSI is mounted, and a terminal group formed at a peripheral portion of the TFT array substrate 110 may be electrically and mechanically connected to each other with an anisotropic conductive layer interposed therebetween.

In addition, in the liquid crystal display device 100, a phase difference plate, a polarizing plate or the like are arranged in a predetermined direction according to kinds of the liquid crystal 150 to be used, that is, operation modes such as a twisted nematic (TN) mode, a C-TN method, a VA mode, and an IPS mode, or a normally white mode/normally black mode, which are not shown in the drawings.

In addition, when the liquid crystal display device 100 is a display device for color display, for example, color filters of red (R), green (G), and blue (B) colors and a protective layer are formed at a region corresponding to each pixel electrode of the TFT array device 110 in the counter substrate 120.

In addition, the electro-optical device using the active matrix substrate 20 may be applied to, for example, an organic EL (electroluminescent) display device.

In the organic EL display device, a thin film containing fluorescent inorganic and organic compounds are interposed between a cathode and an anode, electrons and holes are injected into the thin film to be excited, so that exitons are generated, and light is emitted using emission of light generated when the exitons are recombined (fluorescent light and phosphorescent light).

In addition, materials showing respective R, G, and B light-emitting colors among fluorescent materials used in the organic EL display device, that is, materials for forming the light emitting layers, and materials for forming a hole injection layer and an electron carrying layer are used as ink and are patterned on the active matrix substrate 20 having the TFT 30, thereby manufacturing a self-emitting full color organic EL display device.

In addition, the active matrix substrate 20 may also be applied to a surface conductive electron emission element using a phenomenon that a current flows to the thin film having a small area formed on a plasma display panel (PDP) or the substrate so as to be parallel to the surface of the film, thereby causing an electron emission.

Electronic Apparatus

Next, specific examples of an electronic apparatus of the invention will be described.

Figure 16A:
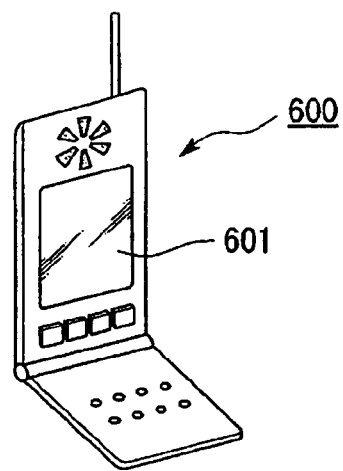
FIG. 16 is a diagram illustrating a specific example of an electronic apparatus.

FIG. 16A is a perspective view illustrating an example of a cellular phone. Referring to FIG. 16A, a reference numeral 600 indicates a main body of the cellular phone, and a reference numeral 601 indicates a display unit having the liquid crystal display device 100 of the above-described embodiment.

Figure 16B:
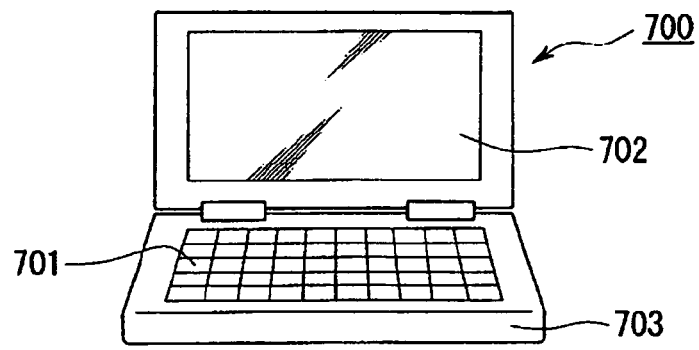

FIG. 16B is a perspective view illustrating an example of a portable information processing device such as a word processor, a personal computer or the like. Referring to FIG. 16B, a reference numeral 700 indicates an information processing device, a reference numeral 701 indicates an input unit such as a keyboard, a reference numeral 703 indicates an information processing main body, and a reference numeral 702 indicates a display unit having the liquid crystal display device 100 of the above-described embodiment.

Figure 16C:
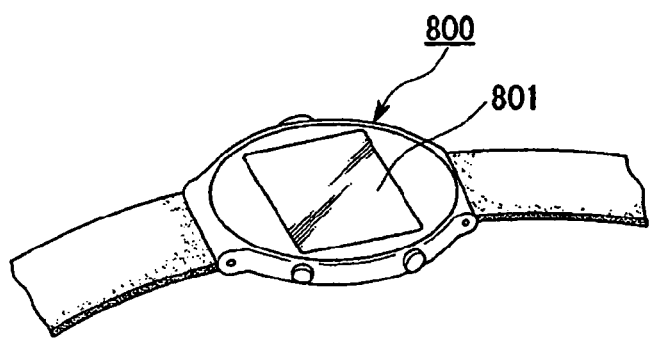
Figure 17:
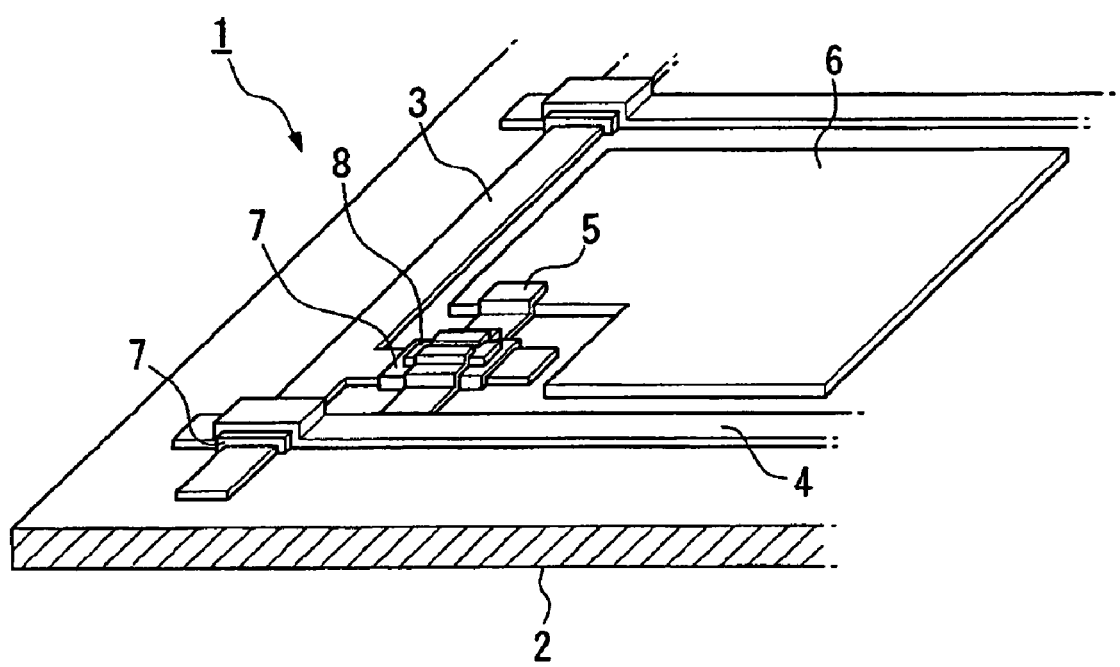
FIG. 17 is a diagram illustrating a conventional active matrix substrate.

FIG. 16C is a perspective view illustrating an example of a wrist-watch-type electronic apparatus. Referring to FIG. 16C, a reference numeral 800 indicates a main body of the watch, and a reference numeral 801 indicates a display unit having the liquid crystal display device 100 of the above-described embodiment.

As such, the electronic apparatuses shown in FIGS. 16A to 16C have the liquid crystal display device 100 of the above-described embodiment, so that a high quality or a high performance can be obtained.

In addition, the present embodiment can be applied to a large-sized liquid crystal panel, such as a television and a monitor.

In addition, the electronic apparatus of the present embodiment has the liquid crystal display device 100, but it may have other electro-optical devices, such as an organic EL display device, a plasma display device, or the like.

The preferred embodiments of the invention have been described with reference to the accompanying drawings, but the invention is not limited thereto. Therefore, various changes and modifications can be made without departing from the spirit or scope of the invention.

What is claimed is:

1. A method of manufacturing an active matrix substrate, comprising:
    forming wiring lines each having a matrix pattern on a substrate such that a wiring line extending in any one of a first direction and a second direction is separated from another wiring line at an intersection;
    forming a laminated portion composed of an insulating layer and a semiconductor layer on a portion of the wiring line and the intersection; and
    forming a conductive layer that electrically connects the separated wiring lines, and a pixel electrode electrically connected to the wiring line via the semiconductor layer on the laminated portion, wherein
    the wiring line includes a source line, a gate line, and a capacitive line extending along the gate line in substantially a straight line;
    the source line, the gate line, and the capacitive line are formed directly on the same face of the substrate;
    while forming the source line, the gate line, and the capacitive line, the source line is formed so as to be separated from the gate line and the capacitive line at intersections therewith; and
    each capacitive line intersects a single pixel electrode between consecutive source lines.

2. The method of manufacturing an active matrix substrate according to claim 1, wherein the forming of the laminated portion includes forming a laminated portion separated at the intersection on the capacitive line.

3. The method of manufacturing an active matrix substrate according to claim 1, wherein the forming of the laminated portion includes subjecting the semiconductor layer to a half exposure process to form a switching element.

4. The method of manufacturing an active matrix substrate according to claim 1, wherein the forming of the conductive layer and the pixel electrode includes disposing a transparent conductive material using an inkjet method.

5. The method of manufacturing an active matrix substrate according to claim 4, wherein the forming of the conductive layer and the pixel electrode includes forming a bank for disposing the transparent conductive material at a predetermined position.

6. The method of manufacturing an active matrix substrate according to claim 1, wherein the forming of the wiring lines includes disposing a conductive material using an inkjet method.

* * * * *